US009991909B2

(12) United States Patent
Watanabe

(10) Patent No.: US 9,991,909 B2
(45) Date of Patent: Jun. 5, 2018

(54) RADIO-FREQUENCY MODULE AND COMMUNICATION DEVICE

(71) Applicant: Murata Manufacturing Co., Ltd., Nagaokakyo-shi, Kyoto-fu (JP)

(72) Inventor: Takashi Watanabe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 58 days.

(21) Appl. No.: 15/297,321

(22) Filed: Oct. 19, 2016

(65) Prior Publication Data

US 2017/0141801 A1 May 18, 2017

(30) Foreign Application Priority Data

Nov. 18, 2015 (JP) ................. 2015-226096

(51) Int. Cl.
*H03H 9/70* (2006.01)
*H04B 1/00* (2006.01)
*H03H 7/01* (2006.01)
*H03H 7/38* (2006.01)
*H03H 7/46* (2006.01)
*H03H 9/54* (2006.01)
*H03H 9/64* (2006.01)

(52) U.S. Cl.
CPC .......... *H04B 1/006* (2013.01); *H03H 7/0115* (2013.01); *H03H 7/38* (2013.01); *H03H 7/46* (2013.01); *H03H 9/54* (2013.01); *H03H 9/64* (2013.01); *H03H 9/70* (2013.01); *H03H 2250/00* (2013.01)

(58) Field of Classification Search
None
See application file for complete search history.

(56) References Cited

U.S. PATENT DOCUMENTS

| 7,148,751 | B2 * | 12/2006 | Weigand | ................... H03F 1/30 330/307 |
| 2005/0170790 | A1 * | 8/2005 | Chang | ................... H04B 1/005 455/90.3 |
| 2008/0119214 | A1 * | 5/2008 | Liu | .......................... H03H 7/38 455/522 |

(Continued)

FOREIGN PATENT DOCUMENTS

WO        2015/019980 A1     2/2015

*Primary Examiner* — David Bilodeau
(74) *Attorney, Agent, or Firm* — Keating & Bennett, LLP

(57) ABSTRACT

A radio-frequency module includes switch elements, first signal paths, band pass filters, first matching circuits, second signal paths, and second matching circuits. Each of the first signal paths is connected between one end of a corresponding one of the switch elements and an antenna terminal. Each of the band pass filters is connected to a corresponding one of the first signal paths and allows a radio-frequency signal of one of the plurality of frequency bands to pass therethrough. Each of the first matching circuits is connected to a corresponding one of the first signal paths. Each of the second signal paths is connected to a corresponding one of the switch elements. Each of the second matching circuits is connected to a corresponding one of the second signal paths. A component included in the first matching circuits and a component included in the second matching circuits are electromagnetically coupled.

20 Claims, 8 Drawing Sheets

(56) References Cited

U.S. PATENT DOCUMENTS

| | | | | |
|---|---|---|---|---|
| 2008/0238567 A1* | 10/2008 | Rosetti | ............... | H03H 7/46 |
| | | | | 333/17.3 |
| 2010/0295629 A1* | 11/2010 | Klemens | ............... | H03F 1/56 |
| | | | | 333/126 |
| 2013/0181788 A1* | 7/2013 | Wan | ............... | H03H 7/38 |
| | | | | 333/32 |
| 2015/0042417 A1* | 2/2015 | Onodera | ............... | H03H 9/6433 |
| | | | | 333/195 |
| 2016/0156328 A1 | 6/2016 | Takeuchi et al. | | |

* cited by examiner

RADIO-FREQUENCY MODULE AND COMMUNICATION DEVICE

CROSS REFERENCE TO RELATED APPLICATIONS

This application claims the benefit of priority to Japanese Patent Application 2015-226096 filed on Nov. 18, 2015. The entire contents of this application are hereby incorporated herein by reference.

BACKGROUND OF THE INVENTION

1. Field of the Invention

The present invention relates to a radio-frequency module disposed between a radio-frequency integrated circuit (RFIC) which performs signal processing on radio-frequency signals of different multiple frequency bands and an antenna which transmits or receives radio-frequency signals, and also to a communication device including the radio-frequency module.

2. Description of the Related Art

In accordance with a reduced size and a more demanding specification of communication devices such as smartphones, a radio-frequency module, such as a radio-frequency front-end module, used in a communication device is becoming increasingly complicated. For example, the mounting density of components on a radio-frequency module is becoming higher and the circuit configuration of a radio-frequency module is becoming more complicated. It is more desirable that such a radio-frequency module exhibit high performance as the entire module by combining plural filters and plural switch circuits.

As an example of such a radio-frequency module, the following configuration is disclosed. A matching circuit between an external-connecting terminal and a filter unit is inductively or capacitively coupled with an inductor between a ground and a filter unit (for example, see International Publication No. 2015/019980).

In the above-described radio-frequency module of the related art, only a single frequency band is used as a communication band. In such a single communication system in which only a single frequency band is used as a communication band, a leakage of a transmitting signal into a reception path can be prevented by separating input and output signal lines from each other, for example.

Lately, radio-frequency modules which support multiband communication have been provided. In such a radio-frequency module, different multiple frequency bands are used as communication bands, and thus, plural band pass filters for the respective multiple frequency bands and a switch to select the communication band may be provided. In a multiband system, the transmit band of a first communication system and the receive band of a second communication system may overlap each other. Because of this reason, in a multiband system, it is more important that desired transmission characteristics be obtained by securing the isolation between an input side and an output side, compared with a single communication system. In order to satisfy such a demand, a circuit on the input side of the switch and a circuit on the output side thereof are generally disposed separately from each other.

However, as the mounting density of components increases, it is more difficult to separate a circuit on the input side of the switch and a circuit on the output side thereof from each other. This makes it more difficult to obtain desired transmission characteristics.

SUMMARY OF THE INVENTION

Preferred embodiments of the present invention provide a radio-frequency module that is able to exhibit improved transmission characteristics while supporting multiband communication.

According to a preferred embodiment of the present invention, there is provided a radio-frequency module that transmits or receives radio-frequency signals of a plurality of frequency bands. The radio-frequency module includes a switch element, a first signal path, a band pass filter, a first matching circuit, a second signal path, and a second matching circuit. The first signal path is connected between one end of the switch element and an antenna terminal. The band pass filter is connected to the first signal path and allows a radio-frequency signal of one of the plurality of frequency bands to pass through the band pass filter. The first matching circuit is connected to the first signal path. The second signal path is connected to the switch element. The second matching circuit is connected to the second signal path. A component included in the first matching circuit and a component included in the second matching circuit are electromagnetically coupled with each other.

Since a component included in the first matching circuit and a component included in the second matching circuit are electromagnetically coupled with each other, the transmission characteristics of the radio-frequency module vary more noticeably than in a radio-frequency module in which corresponding components are not electromagnetically coupled with each other. The transmission characteristics are influenced by the degree of electromagnetic coupling between the first matching circuit and the second matching circuit, that is, the degree of electromagnetic coupling between electromagnetically coupled components. Accordingly, by adjusting the degree of electromagnetic coupling, the transmission characteristics are able to be adjusted. It is thus possible to obtain improved transmission characteristics while supporting multiband communication.

The first signal path may include a plurality of first signal paths. The second signal path may include a plurality of second signal paths. The switch element may selectively connect or disconnect each of the plurality of first signal paths and a corresponding one of the plurality of second signal paths.

With this configuration, the plurality of second signal paths are provided. Accordingly, it is possible to switch between a propagation path for radio-frequency signals of a low frequency band group and a propagation path for radio-frequency signals of a high frequency band group. Generally, a frequency-dependent matching circuit is able to be provided on each of the plurality of second signal paths, thus achieving a sufficient level of impedance matching in all the frequency bands. As a result, the insertion loss and the return loss of radio-frequency signals are able to be significantly reduced or prevented, thus obtaining even more improved transmission characteristics.

The first matching circuit may be disposed on each of two or more of the plurality of first signal paths. The second matching circuit may be disposed on each of two or more of the plurality of second signal paths. Components included in at least a portion of the first matching circuits may be electromagnetically coupled with corresponding components included in at least a portion of the second matching circuits.

With this configuration, components included in at least a portion of the first matching circuits and components included in a portion of the second matching circuits are electromagnetically coupled with each other. It is thus possible to obtain improved transmission characteristics for plural radio-frequency signals including different pass bands.

The switch element may be selectively set to be in a connecting state or a disconnecting state so that a component included in the first matching circuit on a first signal path and a component included in the second matching circuit on a second signal path, the components being electromagnetically coupled with each other, will be connected to each other.

With this configuration, the switch element connects the electromagnetically coupled components of the first matching circuit and the second matching circuit. Accordingly, a radio-frequency signal propagates through the following paths in the radio-frequency module. The radio-frequency signal propagates, not only through a main path via the first matching circuit, the switch element, and the second matching circuit, but also through a sub path from the first matching circuit to the second matching circuit not via the switch element. Thus, the transmission characteristics of the radio-frequency module include the combined transmission characteristics of the main path and the sub path. The transmission characteristics of the sub path are influenced by the degree of electromagnetic coupling between the electromagnetically coupled components. Accordingly, by adjusting the degree of electromagnetic coupling, the combined transmission characteristics are able to be adjusted. As a result, improved transmission characteristics are able to be obtained.

The switch element may be selectively set to be in a connecting state or a disconnecting state so that a component included in the first matching circuit on a first signal path and a component included in the second matching circuit on a second signal path, the components being electromagnetically coupled with each other, will not be connected to each other.

With this configuration, the switch element does not connect the electromagnetically coupled components of the first matching circuit and the second matching circuit. Accordingly, due to the occurrence of mutual induction in the electromagnetically coupled components, the effective inductance value of each of the electromagnetically coupled components is able to be changed. The effective inductance value is influenced by the degree of electromagnetic coupling between these components. Accordingly, by adjusting the degree of electromagnetic coupling, the effective inductance value is adjusted. As a result, improved transmission characteristics are able to be obtained.

The switch element may selectively connect or disconnect each of the plurality of first signal paths and a corresponding one of the plurality of second signal paths through which a radio-frequency signal of a low frequency band among the plurality of frequency bands passes. The switch element may selectively connect or disconnect each of the plurality of first signal paths and a corresponding one of the plurality of second signal paths through which a radio-frequency signal of a high frequency band among the plurality of frequency bands passes.

With this configuration, the switch element selectively connects or disconnects the first signal path and the second signal path for a radio-frequency signal of a low frequency band and those for a radio-frequency signal of a high frequency band. As a result, it is possible to obtain improved transmission characteristics for both of the low frequency band and the high frequency band.

A carrier aggregation system in which radio-frequency signals of at least two of the plurality of frequency bands are simultaneously transmitted or received may be applied to the radio-frequency module. The switch element may be selectively set to be in a connecting state or a disconnecting state so that at least two of the plurality of first signal paths and at least two of the plurality of second signal paths will be simultaneously connected to each other.

With this configuration, it is possible to obtain improved transmission characteristics while supporting multiband communication and the carrier aggregation system.

The radio-frequency module may further include a module substrate to mount the switch element thereon. Each of the first and second matching circuits may include a component to be mounted on the module substrate or a component to be integrated in the module substrate. A component included in the first matching circuit and a component included in the second matching circuit may be disposed close or adjacent to each other.

Generally, a component included in a circuit on the input side of a switch element and a component included in a circuit on the output side thereof are separately disposed. Accordingly, it is difficult to secure a high degree of electromagnetic coupling between these components. In contrast, by disposing a component included in the first matching circuit and a component included in the second matching circuit close or adjacent to each other, an improved degree of electromagnetic coupling between these components is able to be secured. Since the degree of electromagnetic coupling is able to be adjusted in a wide range, the transmission characteristics are able to be adjusted with improved precision, thus achieving even more improved transmission characteristics.

A distance between the component included in the first matching circuit and the component included in the second matching circuit may be smaller than a distance between the component included in the first matching circuit and another component mounted on the module substrate or integrated in the module substrate.

This makes it possible to significantly reduce or prevent electromagnetic coupling between the component included in the first matching circuit and another component. At the same time, electromagnetic coupling between the component included in the first matching circuit and the component included in the second matching circuit is secured. As a result, improved transmission characteristics are able to be obtained.

In a plan view of the module substrate, the component included in the first matching circuit and the component included in the second matching circuit may be disposed on one of two areas of the module substrate with respect to a straight line passing through the switch element.

With this configuration, these components are able to be electromagnetically coupled with each other more reliably, compared with a configuration in which a component included in the first matching circuit is disposed on one of the above-described two areas, while a component included in the second matching circuit is disposed on the other area. As a result, improved transmission characteristics are able to be obtained.

The radio-frequency module may further include a second matching circuit group including a plurality of matching circuits which include the second matching circuit. In a plan view of the module substrate, the component included in the second matching circuit may be disposed close or adjacent to a first side forming an outer periphery of the module substrate. In a plan view of the module substrate, a component included in a matching circuit of the second matching circuit group which is different from the second matching circuit may be disposed close or adjacent to a second side which opposes the first side.

With this configuration, the second matching circuit is disposed close or adjacent to one side of the module substrate, while another matching circuit included in the second matching circuit group is disposed close or adjacent to the opposing side of the module substrate. This makes it possible to significantly reduce or prevent unwanted electromagnetic coupling between the second matching circuit and this matching circuit. As a result, improved transmission characteristics are able to be obtained.

The radio-frequency module may further include a first matching circuit group including three matching circuits which include the first matching circuit. In a plan view of the module substrate, components included in the three matching circuits may be disposed close or adjacent to three different sides defining an outer periphery of the module substrate.

With this configuration, the three matching circuits included in the first matching circuit group are disposed close or adjacent to three different sides of the module substrate. This makes it possible to significantly reduce or prevent unwanted electromagnetic coupling among the three matching circuits. As a result, improved transmission characteristics are able to be obtained.

A preferred embodiment of the present invention may be implemented, not only as a radio-frequency module, but also as a communication device. According to a preferred embodiment of the present invention, there is provided a communication device including a radio-frequency integrated circuit that performs signal processing on radio-frequency signals of a plurality of frequency bands, an antenna, and the above-described radio-frequency module that is connected to the radio-frequency integrated circuit and the antenna.

By using the above-described radio-frequency module, it is possible to implement a high-quality communication device which secures improved transmission characteristics while supporting multiband communication.

According to preferred embodiments of the present invention, it is possible to obtain improved transmission characteristics while supporting multiband communication.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
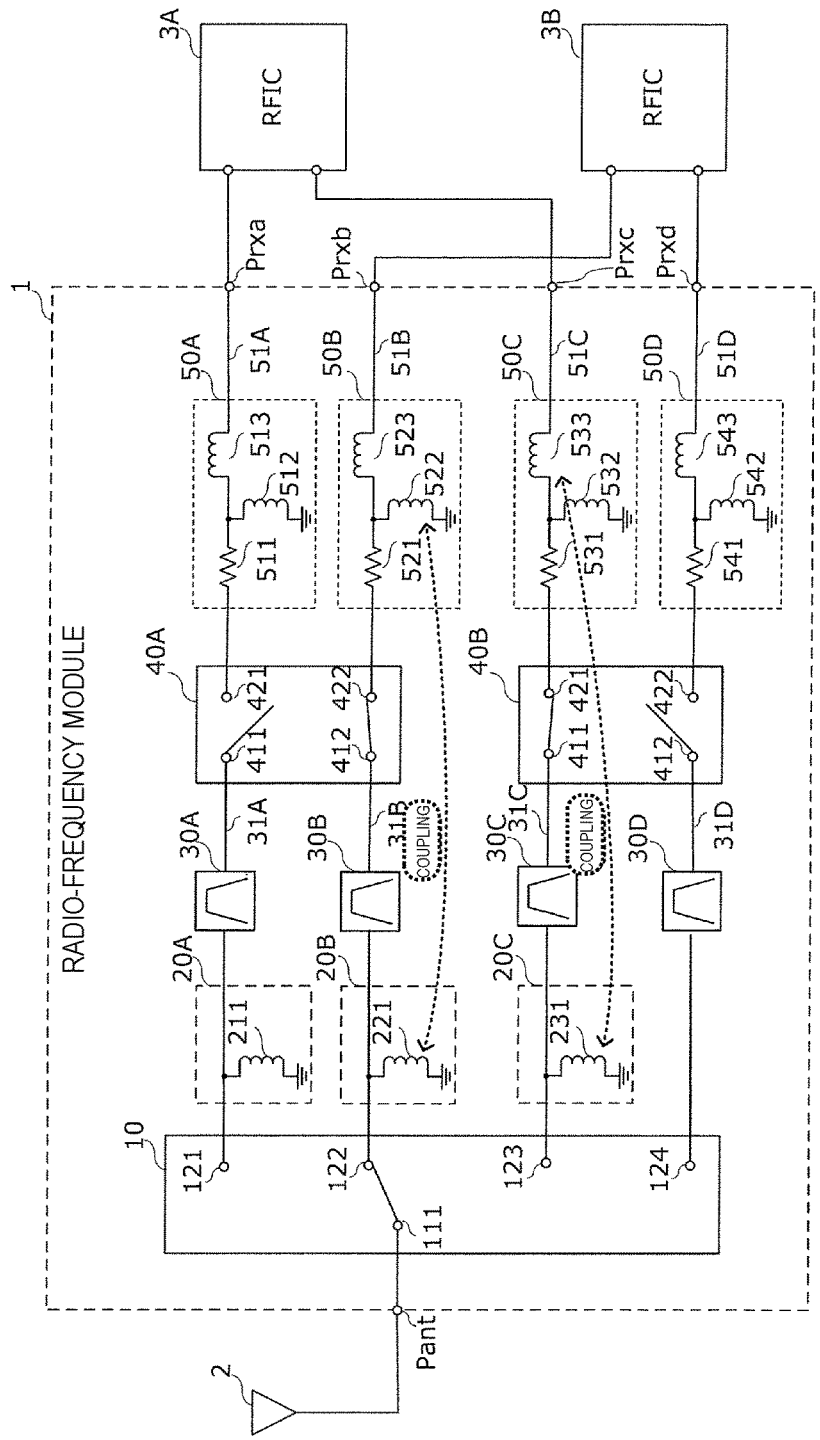
FIG. 1 is a circuit diagram illustrating the circuit configuration of a radio-frequency module according to a first preferred embodiment of the present invention.

Preferred embodiments of the present invention will be described below in detail with reference to the accompanying drawings. The preferred embodiments described below illustrate general or specific examples. Numeric values, materials, components, and positions and connection states of the components illustrated in the following preferred embodiments of the present invention are only examples, and are not described for limiting the present preferred embodiments of the present invention. In the following preferred embodiments of the present invention, the meaning of "being connected" preferably includes that components are directly connected to each other or that components are electrically connected to each other via another element.

The drawings illustrate examples of radio-frequency modules and a communication device only schematically, and do not necessarily illustrate them precisely. In the drawings, the same or substantially the same components and configurations are designated by like reference numerals, and an explanation thereof may not be given more than once or may be simplified from the second time.

First Preferred Embodiment

A radio-frequency module according to a first preferred embodiment of the present invention transmits or receives radio-frequency signals of multiple frequency bands. Such a radio-frequency module is provided, for example, in a front-end portion of a multiband-support cellular phone which is compliant with communication standards such as LTE (Long Term Evolution), and propagates radio-frequency signals of multiple frequency bands between an antenna and an RFIC.

FIG. 1 is a circuit diagram illustrating an example of the circuit configuration of a radio-frequency module 1 according to the first preferred embodiment of the present invention. In FIG. 1, an antenna 2 and RFICs 3A and 3B to which the radio-frequency module 1 is connected are also shown. A common matching circuit, such as an inductor, may be disposed between the radio-frequency module 1 and the antenna 2, but it is not shown in FIG. 1. In FIG. 1, electromagnetic coupling of components included in the radio-frequency module 1 is indicated by dashed lines. Radio-frequency modules are indicated in the other drawings in a similar manner.

The radio-frequency module 1 is disposed between an RFIC which performs signal processing on radio-frequency signals of different multiple frequency bands and an antenna which transmits or receives radio-frequency signals. In the first preferred embodiment of the present invention, the radio-frequency module 1 is preferably a receive-side front-end module which is disposed between one antenna 2 and two RFICs 3A and 3B and propagates radio-frequency signals of multiple frequency bands received by the antenna 2 to the RFICs 3A and 3B.

The antenna 2 is, for example, an LTE antenna, which transmits a transmitting signal propagated by a transmit-side front-end module and receives a transmitting signal from another cellular phone, for example.

The RFICs 3A and 3B are signal processing circuits which perform signal processing on radio-frequency signals of different multiple frequency bands (for example, four received signals in the first preferred embodiment of the present invention). The RFICs 3A and 3B amplify and demodulate received signals, for example. In the first preferred embodiment of the present invention, the RFIC 3A performs signal processing on a received signal of a first frequency band which belongs to an LTE-standard low frequency band group (for example a band group of about 800 MHz to about 900 MHz, hereinafter referred to as the "low band (LB) band") and a received signal of a third frequency band which belongs to an LTE-standard high frequency band group of a higher frequency side than the low frequency band (for example, a band group of about 1700 MHz to about 2000 MHz, hereinafter referred to as the "middle band (MB) band"). In the first preferred embodiment of the present invention, the RFIC 3B performs signal processing on a received signal of a second frequency band which belongs to the LB band and a received signal of a fourth frequency band which belongs to the MB band.

Each of the RFICs 3A and 3B includes a low-band receive terminal to receive LB-band received signals and a high-band receive terminal to receive MB-band received signals.

The bands of received signals on which the RFIC 3A performs signal processing may be different from those on which the RFIC 3B performs signal processing. The number of low-band receive terminals and that of high-band receive terminals of each of the RFICs 3A and 3B are not restricted to one. For example, each of the RFICs 3A and 3B may have one low-band receive terminal and two high-band receive terminals.

An example of the circuit configuration of the radio-frequency module 1 will be specifically described below.

As shown in FIG. 1, the radio-frequency module 1 includes an antenna terminal Pant connected to the antenna 2 and four receive terminals Prxa, Prxb, Prxc, and Prxd connected to the RFICs 3A and 3B. The radio-frequency module 1 filters a received signal which is input into the antenna terminal Pant from the antenna 2 and outputs a filtered signal to one of the RFICs 3A and 3B via a corresponding one of the receive terminals Prxa, Prxb, Prxc, and Prxd.

Among the four receive terminals Prxa, Prxb, Prxc, and Prxd, the receive terminals Prxa and Prxc preferably correspond to the RFIC 3A, while the receive terminals Prxb and Prxd preferably correspond to the RFIC 3B. More specifically, the receive terminal Prxa is preferably used to output an LB-band received signal to the low-band receive terminal of the RFIC 3A, while the receive terminal Prxc is preferably used to output an MB-band received signal to the high-band receive terminal of the RFIC 3A. The receive terminal Prxb is preferably used to output an LB-band received signal to the low-band receive terminal of the RFIC 3B, while the receive terminal Prxd is preferably used to output an MB-band received signal to the high-band receive terminal of the RFIC 3B.

The radio-frequency module 1 includes, preferably from the side closer to the antenna terminal Pant, a switch element 10, first matching circuits 20A through 20C, band pass filters 30A through 30D, switch elements 40A and 40B, and second matching circuits 50A through 50D.

The switch element 10 includes one or more input terminals connected to the antenna 2 (in this case, one input terminal 111, for example) and plural output terminals corresponding to plural first signal paths (in this case, for example, four output terminals 121 through 124 corresponding to four first signal paths 31A through 31D). In the first preferred embodiment of the present invention, the switch element 10 selectively connects the input terminal 111 to one of the output terminals 121 through 124 and disconnects the input terminal 111 from the other terminals, for example. The switch element 10 is preferably a switch to select the radio-frequency band and is operated in accordance with a control signal input from the outside of the radio-frequency module 1, for example, from the RFICs 3A and 3B. The switch element 10 may also be operated in accordance with a control signal generated within the radio-frequency module 1.

The first matching circuits 20A through 20C are included in a first matching circuit group, and are preferably disposed between the associated band pass filters (in this case, band pass filters 30A through 30C) and the antenna 2 on one or more of the plural first signal paths 31A through 31D corresponding to plural frequency bands (in this case, the three first signal paths 31A through 31C). The first matching circuits 20A through 20C perform impedance matching between the associated band pass filters 30A through 30C and the antenna 2. In the first preferred embodiment of the present invention, the first matching circuits 20A through 20C include inductors 211, 221, and 231, respectively, which are shunt-connected to a ground.

The first matching circuits 20A through 20C are connected to the first signal paths 31A through 31C, respectively. The first signal paths 31A and 31B are preferably connected between the antenna terminal Pant and one end of the switch element 40A (in the first preferred embodiment of the present invention, input terminals 411 and 412, which will be discussed later), while the first signal paths 31C and 31D are connected between the antenna terminal Pant and one end of the switch element 40B (in the first preferred embodiment of the present invention, input terminals 411 and 412, which will be discussed later).

In the first preferred embodiment of the present invention, although a first matching circuit is preferably not disposed between the band pass filter 30D and the antenna 2, it may be disposed therebetween. The components included in the first matching circuits 20A through 20C are not restricted to shunt-connected inductors. Other components may be used as long as components including a capacitor or an inductor are included in the first matching circuits 20A through 20C, for example. As components including a capacitor or an inductor, chip components may be used, or pattern conductors provided on a substrate may be used.

The band pass filters 30A through 30D are disposed on the first signal paths 31A through 31D, respectively, corresponding to the multiple frequency bands, and use these frequency bands as pass bands. More specifically, in order to support multiband communication of the radio-frequency module 1, the band pass filters 30A through 30D filter received signals input from the antenna 2 by using different multiple frequency bands (pass bands) and allow the corresponding received signals to pass therethrough. With this preferable configuration, the first signal paths 31A through 31D are able to be used to propagate received signals of different multiple frequency bands.

For example, the band pass filter 30A is preferably configured so that the pass band will be the first frequency band (LB band), while the band pass filter 30B is preferably configured so that the pass band will be the second frequency band (LB band), which is preferably higher than the first frequency band. The band pass filter 30C is preferably configured so that the pass band will be the third frequency band (MB band), while the band pass filter 30D is preferably configured so that the pass band will be the fourth frequency band (MB band), which is higher than the third frequency band.

The band pass filters 30A through 30D are connected to the first signal paths 31A through 31D, respectively, and each allow one of multiple radio-frequency signals to pass therethrough. That is, a radio-frequency signal of one of the multiple frequency bands passes through each of the band pass filters 30A through 30D, for example.

In the first preferred embodiment of the present invention, the band pass filters 30A through 30D preferably include surface acoustic wave (SAW) filters using SAWs. Instead of using SAW filters, the band pass filters 30A through 30D may also include another type of elastic wave filter, for example, elastic wave filters using bulk acoustic waves (BAWs). Instead of using elastic wave filters, the band pass filters 30A through 30D may also include filters defined by suitably combining chip inductors and chip capacitors.

The switch elements 40A and 40B are preferably disposed between the band pass filters 30A through 30D and the RFICs 3A and 3B. The switch elements 40A and 40B selectively connect or disconnect the plural first signal paths 31A through 31D and one or more second signal paths 51A through 51D corresponding to the RFICs 3A and 3B. The switch elements 40A and 40B are switches that enable selecting the frequency band and the RFIC and are operated in accordance with a control signal input from the outside of the radio-frequency module 1, for example, from the RFICs 3A and 3B. The switch elements 40A and 40B may also be operated in accordance with a control signal generated within the radio-frequency module 1.

The switch element 40A selectively connects or disconnects plural first signal paths (in this case, the first signal paths 31A and 31B) and associated plural second signal paths (in this case, the second signal paths 51A and 51B) through which radio-frequency signals of the low frequency band pass. The switch element 40B selectively connects or disconnects plural first signal paths (in this case, the first signal paths 31C and 31D) and associated plural second signal paths (in this case, the second signal paths 51C and 51D) through which radio-frequency signals of the high frequency band pass.

More specifically, the switch element 40A selectively connects or disconnects the first signal paths 31A and 31B corresponding to the low frequency band group and the second signal paths 51A and 51B corresponding to the RFICs 3A and 3B, respectively. In the first preferred embodiment of the present invention, the switch element 40A includes two input terminals 411 and 412 corresponding to the first signal paths 31A and 31B, respectively, and two output terminals 421 and 422 corresponding to the second signal paths 51A and 51B, respectively, and selectively connects or disconnects the input terminals 411 and 412 and the output terminals 421 and 422, respectively. That is, the switch element 40A connects a certain input terminal and a certain output terminal with each other.

The switch element 40B selectively connects or disconnects the first signal paths 31C and 31D corresponding to the high frequency band group, which is higher than the low frequency band group, and the second signal paths 51C and 51D corresponding to the RFICs 3A and 3B, respectively. The configuration of the switch element 40B is similar to that of the switch element 40A, except for the paths to which the switch element 40B is connected, and thus, an explanation of the detailed configuration of the switch element 40B will be omitted.

The switch elements 40A and 40B are provided on, for example, a semiconductor substrate, and, in the first preferred embodiment of the present invention, they are preferably provided as one IC package (switch IC) that also includes the switch element 10. That is, the switch elements 10, 40A, and 40B are preferably provided on one semiconductor substrate. Alternatively, at least one of the switch elements 10, 40A, and 40B may be provided on another semiconductor substrate, or the switch elements 10, 40A, and 40B may be provided as different IC packages.

By providing the switch elements 40A and 40B configured as described above, the second signal paths 51A and 51B are able to be connected to the first signal paths 31A and 31B, respectively, to propagate LB-band received signals therethrough. That is, LB-band received signals are able to be input into both of the RFICs 3A and 3B. The second signal paths 51C and 51D are able to be connected to the first signal paths 31C and 31D, respectively, to propagate MB-band received signals therethrough. That is, MB-band received signals are able to be input into both of the RFICs 3A and 3B. It is thus possible to reduce the number of receive terminals of the RFICs 3A and 3B connected to the radio-frequency module 1.

More specifically, in each of the multiband-support RFICs 3A and 3B, instead of providing the same number of receive terminals as the number of all frequency bands (in this case, four frequency bands), one common low-band receive terminal corresponding to the LB band and one common high-band receive terminal corresponding to the MB band are provided. Generally, when more receive terminals to receive radio-frequency signals are provided in RFICs, the cost becomes higher. Accordingly, by providing the switch elements 40A and 40B, the number of receive terminals of the RFICs 3A and 3B is able to be reduced, thus decreasing the cost of the RFICs 3A and 3B, based on the generalization above.

The second matching circuits 50A through 50D are included in a second matching circuit group and are disposed on at least one or more second signal paths (in this case, all the second signal paths 51A through 51D). The second matching circuits 50A through 50D perform impedance matching between the associated band pass filters 30A through 30B and the RFICs 3A and 3B. In the first preferred embodiment of the present invention, the second matching circuits 50A through 50D include resistors 511, 521, 531, and 541, respectively, which are series-connected to the associated second signal paths 51A through 51D, inductors 513, 523, 533, and 543, and inductors 512, 522, 532, and 542 which are shunt-connected between a ground and nodes between the resistors 511, 521, 531, and 541 and the inductors 513, 523, 533, and 543, respectively.

The second matching circuits 50A through 50D are connected to the second signal paths 51A through 51D, respectively. The second signal paths 51A through 51D are connected to the switch elements 40A and 40B. More specifically, the second signal paths 51A and 51B are connected to the other ends of the switch element 40A (in the first preferred embodiment of the present invention, the output terminals 421 and 422), while the second signal paths 51C and 51D are connected to the other ends of the switch element 40B (in the first preferred embodiment of the present invention, the output terminals 421 and 422).

In the first preferred embodiment of the present invention, the second matching circuits 50A through 50D are preferably disposed on the second signal paths 51A trough 51D, respectively. However, a second matching circuit may not be disposed if it is not necessary. The components included in each of the second matching circuits 50A through 50D are not restricted to one resistor and two inductors. Other components may be included as long as components including a capacitor or an inductor are used are included in the second matching circuits 50A through 50D. As components including a capacitor or an inductor, chip components may be used, or pattern conductors formed on a substrate may be used.

In the radio-frequency module 1, preferably configured as described above, one or more of the components included in the first matching circuits 20A through 20C and one or more of the components included in the second matching circuits 50A through 50D are electromagnetically coupled with each other.

More specifically, in the first preferred embodiment of the present invention, on each of two or more of the plural first signal paths 31A through 31D (in this case, the two first signal paths 31B and 31C), a first matching circuit (in this case, the first matching circuits 20B and 20C) electromagnetically coupled with the associated one of the second matching circuits 50A through 50D is disposed. On two or more of the plural second signal paths 51A through 51D (in this case, the two second signal paths 51B and 51C), the second matching circuits (in this case, the second matching circuits 50B and 50C) which are electromagnetically coupled with two or more first matching circuits (in this case, the first matching circuits 20B and 20C) based on a one-to-one correspondence are disposed, for example.

In the first preferred embodiment of the present invention, the component included in the first matching circuit 20B is electromagnetically coupled with a component included in the second matching circuit 50B, while the component included in the first matching circuit 20C is electromagnetically coupled with a component included in the second matching circuit 50C. In other words, the components included in the first matching circuits 20B and 20C and the components included in the second matching circuits 50B and 50C are electromagnetically coupled with each other based on a one-to-one correspondence.

More specifically, in the first preferred embodiment of the present invention, the inductor 221 included in the first matching circuit 20B and the inductor 522 included in the second matching circuit 50B are electromagnetically coupled with each other, while the inductor 231 included in the first matching circuit 20C and the inductor 533 included in the second matching circuit 50C are electromagnetically coupled with each other.

Figure 2:
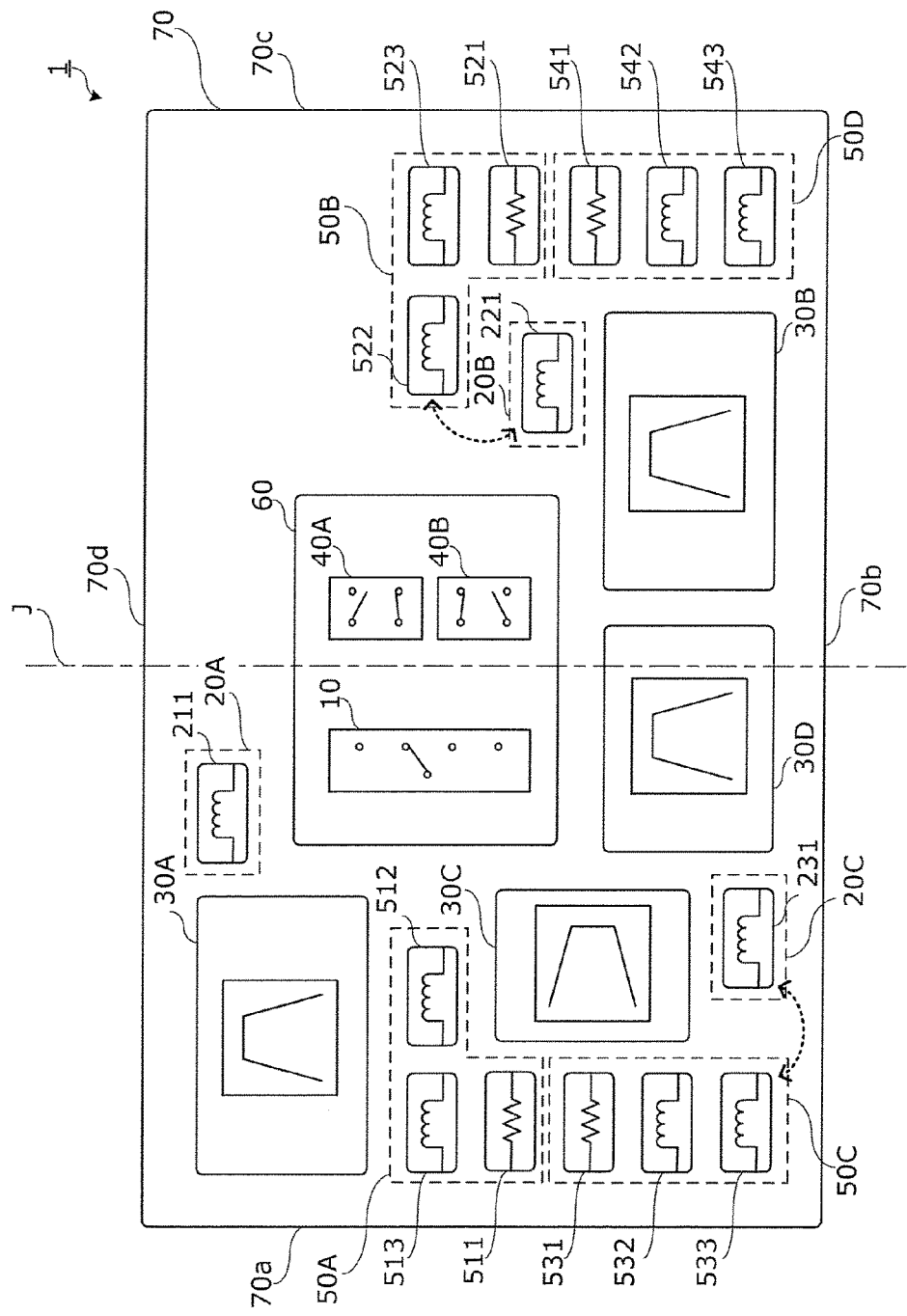
FIG. 2 is a plan view schematically illustrating the layout of components included on a mounting surface of the radio-frequency module according to the first preferred embodiment of the present invention.

FIG. 2 is a plan view schematically illustrating the layout of the components included on the mounting surface of the radio-frequency module 1 according to the first preferred embodiment of the present invention. The components such as chip components illustrated in FIG. 2 have patterns similar to those shown in FIG. 1 merely for the sake of convenience. In FIG. 2, wiring to connect components is not shown. The other plan views schematically illustrating the layout of components are also represented in the same or similar manner.

As shown in FIG. 2, the radio-frequency module 1 includes a module substrate 70 to mount the switch elements 40A and 40B thereon. In a plan view of the module substrate 70, the module substrate 70 is, for example, a multilayer substrate formed in a rectangular or substantially rectangular shape having four sides 70a through 70d as the outer periphery. The module substrate 70 preferably includes plural ceramic sheets or epoxy resin sheets stacked on each other. The module substrate 70 is not restricted to a rectangular or substantially rectangular shape, and may be another polygonal shape. The module substrate 70 may also be a single layer substrate.

In the first preferred embodiment of the present invention, the switch elements 10, 40A, and 40B are integrated in a single switch IC 60 and are mounted on the module substrate 70. The switch IC 60 is disposed on the central region of the rectangular or substantially rectangular module substrate 70.

In the first preferred embodiment of the present invention, the band pass filters 30A through 30D are preferably individually formed into packages and are disposed on the module substrate 70. That is, the band pass filters 30A through 30D are provided on individual piezoelectric substrates. Alternatively, at least some of the band pass filters 30A through 30D may be provided into the same package. The band pass filters 30A through 30D may be dies which are not packaged and may be directly mounted on the module substrate 70 including a cavity structure.

Each of the first matching circuits 20A through 20C and the second matching circuits 50A through 50D are able to include a component mounted on or integrated in the module substrate 70. In the first preferred embodiment of the present invention, each of the first matching circuits 20A through 20C and the second matching circuits 50A through 50D includes a component mounted on the module substrate 70. More specifically, the inductors included in the first matching circuits 20A through 20C and the inductors and resistors included in the second matching circuits 50A through 50D are preferably chip components and are disposed on peripheral regions, which are different from the central region, of the module substrate 70.

A corresponding one of the first matching circuits 20A through 20C including one of the two electromagnetically coupled components and a corresponding one of the second matching circuits 50A through 50D including the other component are disposed close or adjacent to each other. More specifically, in the first preferred embodiment of the present invention, the first matching circuit 20B and the second matching circuit 50B are disposed close or adjacent to each other, while the first matching circuit 20C and the second matching circuit 50C are disposed close or adjacent to each other.

The meaning of "a certain first matching circuit and a certain second matching circuit are disposed close to each other" is that the distance between the certain first matching circuit and the certain second matching circuit is shorter than the distances between the certain first matching circuit and the other second matching circuits of the second matching circuit group. This definition also applies to the meanings of "components are disposed close to each other" and "a certain component is disposed close to a certain side of the module substrate 70". That is, the meaning of "a certain component is disposed close to another component" is that the distance between these components is shorter than the distances between this certain component and the other components. The meaning of "a certain component is disposed close to one of the sides 70a through 70d of the module substrate 70" is that the distance between the certain component and the one of the sides is shorter than the distances between the certain component and the other sides of the module substrate 70.

The components included in the first matching circuit 20B and the second matching circuit 50B and that of the components included in the first matching circuit 20C and the second matching circuit 50C will be discussed below. These two arrangements are the same or similar to each other. Accordingly, the arrangement of the components included in the first and second matching circuits 20B and 50B will be discussed, and an explanation of the arrangement of the components included in the first and second matching circuits 20C and 50C will be omitted.

In a plan view of the module substrate 70, the components included in the first and second matching circuits 20B and 50B are disposed on one of the two areas of the module substrate 70 with respect to a straight line (for example, the imaginary line J in FIG. 2) passing near the switch elements 40A and 40B (passing through the switch IC 60). More specifically, the component (inductor 221) included in the first matching circuit 20B and the components (the resistor 521 and the inductors 522 and 523) included in the second matching circuit 50B are disposed close or adjacent to each other.

The distance between the component included in the first matching circuit 20B and the components included in the second matching circuit 50B is smaller than the distances between the component included in the first matching circuit 20B and the other components mounted on or integrated in the module substrate 70. That is, in a plan view of the module substrate 70, the distance between the region surrounded by the outer configuration of the component included in the first matching circuit 20B and the region surrounded by the outer configuration of the components included in the second matching circuit 50B is smaller than the distances between the region surrounded by the outer configuration of the component included in the first matching circuit 20B and the regions surrounded by the outer configurations of the other components. This will be explained more specifically by focusing on the inductors 221 and 522 electromagnetically coupled with each other. The inductor 221 is disposed at a position at which the distance between the inductors 221 and 522 is smaller than the distances between the inductor 221 and the other components.

The inductors 221 and 522 electromagnetically coupled with each other are disposed so that, for example, the winding axes of the coils included in the inductors 221 and 522 are able to be parallel or substantially parallel with each other. In the first preferred embodiment of the present invention, the inductors 221 and 522 are disposed so that both of the winding axes of the coils will be perpendicular or substantially perpendicular to a main surface of the module substrate 70. With this arrangement, the magnetic flux of the inductor 221 and that of the inductor 522 preferably interlink each other so that the inductors 221 and 522 are able to be electromagnetically coupled with each other. The degree of electromagnetic coupling between the inductors 221 and 522 becomes greater as the distance therebetween is smaller. The degree of electromagnetic coupling between the inductors 221 and 522 also becomes greater as the winding axes of the inductors 221 and 522 are more accurately parallel with each other and the distance between the winding axes is smaller. Accordingly, by adjusting the distance between the inductors 221 and 522 and the relative arrangement of the inductors 221 and 522, the degree of electromagnetic coupling therebetween is able to be adjusted.

The inductors 221 and 522 are able to be disposed so that the winding axes are able to be parallel or substantially parallel with a main surface of the module substrate 70.

In the first preferred embodiment of the present invention, in a plan view of the module substrate 70, among the second matching circuits 50A through 50D included in the second matching circuit group, the components included in the second matching circuit 50B are disposed close or adjacent to the side 70c of the outer periphery of the module substrate 70, and the components included in another second matching circuit (in this case, the second matching circuit 50A or 50C) are disposed close or adjacent to the side 70a which opposes the side 70c.

In the first preferred embodiment of the present invention, in a plan view of the module substrate 70, the components of three matching circuits (in this case, the first matching circuits 20A through 20C) included in the first matching circuit group are disposed close or adjacent to three different sides of the outer periphery of the module substrate 70. More specifically, the first matching circuit 20A is disposed close or adjacent to the side 70d, the first matching circuit 20B is disposed close or adjacent to the side 70c, and the first matching circuit 20C is disposed close or adjacent to the side 70b.

In the first preferred embodiment of the present invention, the components included in the radio-frequency module are preferably disposed on the same mounting surface of the module substrate 70. However, the components may be distributed over the opposing front and the back surfaces of the module substrate 70. The components may not necessarily be disposed on the single module substrate 70, but may be distributed over plural substrates. On the back side of the mounting surface of the module substrate 70, mounting electrodes that enable mounting the radio-frequency module 1 on a mother substrate within a cellular phone are able to be provided. The components mounted on the mounting surface may be sealed with a sealing resin, such as epoxy resin. A shielding film made of Ag, for example, formed by applying a paste or sputtering may be provided on the surface of the sealing resin, for example.

As a result of the radio-frequency module 1, as described above being preferably operated in the following manner, a radio-frequency signal of one of multiple frequency bands selectively propagates through the radio-frequency module 1.

If a signal of the second frequency band (LB band) is received from the antenna 2 and if the RFIC 3B performs signal processing on the received signal, the switch elements 10, 40A, and 40B are preferably operated in the following manner in accordance with an input control signal.

The switch element 10 connects the input terminal 111 to the output terminal 122 corresponding to the second frequency band and also disconnects the input terminal 111 from the output terminals 121, 123, and 124 corresponding to the other frequency bands.

The switch element 40A connects the input terminal 412 corresponding to the second frequency band to the output terminal 422 corresponding to the RFIC 3B, and also disconnects the input terminal 411 from the output terminal 421 corresponding to the RFIC 3A. In other words, in the first preferred embodiment of the present invention, the switch element 40A selectively connects or disconnects the input terminals and the output terminals so that one of the first signal paths 31A through 31D on which the first matching circuit including one of the two electromagnetically coupled components is disposed (in this case, the first signal path 31B on which the first matching circuit 20B is disposed) is able to be connected to one of the second signal paths 51A through 51D on which the second matching circuit including the other component is disposed (in this case, the second signal path 51B on which the second matching circuit 50B is disposed).

The connection and disconnection states of the switch element 40B are preferably not restricted, and the switch element 40B may be operated similarly to the switch element 40A.

That is, the switch elements 40A and 40B are selectively set to be a connection state or a disconnection state so that the components included in the first matching circuits 20B and 20C disposed on the first signal paths 31B and 31C are able to respectively connected to the components included in the second matching circuits 50B and 50C disposed on the second signal paths 51B and 51C.

As a result of the switch elements 10, 40A, and 40B being operated in this manner, a received signal input into the antenna terminal Pant from the antenna 2 passes through the switch element and the first matching circuit 20B, and is subjected to filtering in the band pass filter 30B, and then passes through the switch element 40A and the second matching circuit 50B and is output to the RFIC 3B from the receive terminal Prxb.

As described above, a component included in the first matching circuit 20B (inductor 221) and a component included in the second matching circuit 50B (inductor 522) are electromagnetically coupled with each other. This means that the electromagnetically coupled components are connected to each other in a radio-frequency range. This also means that the first matching circuit 20B and the second matching circuit 50B are connected to each other in a radio-frequency range. Thus, the above-described received signal propagates through the radio-frequency module 1 in the following manner.

Between the antenna terminal Pant and the receive terminal Prxb, the received signal propagates, not only through a path (main path) via the switch element 40A, but also through a path (sub path) from the first matching circuit 20B to the second matching circuit 50B not via the switch element 40A. Hence, a combined signal of the received signal propagating through the main path and the received signal propagating through the sub path is output from the receive terminal Prxb. That is, the transmission characteristics such as the attenuation characteristic (amplitude characteristic) and the phase characteristic of the radio-frequency module 1 are represented by the combined transmission characteristics of the main path and the sub path.

The transmission characteristics of the sub path depend on the degree of electromagnetic coupling between the first matching circuit 20B and the second matching circuit 50B. In other words, by adjusting the degree of electromagnetic coupling between the first matching circuit 20B and the second matching circuit 50B, the amplitude and the phase of the received signal propagating through the sub path is able to be adjusted. Accordingly, in the first preferred embodiment of the present invention, by adjusting the distance between the inductors 221 and 522 and the relative arrangement of the inductors 221 and 522, it is possible to obtain desired transmission characteristics of the radio-frequency module 1 when a signal of the second frequency band is received.

If a signal of the third frequency band (MB band) is received from the antenna 2 and if the RFIC 3A performs signal processing on the received signal, the switch elements 10, 40A, and 40B are preferably operated in the following manner in accordance with an input control signal.

The switch element 10 connects the input terminal 111 to the output terminal 123 corresponding to the third frequency band and also disconnects the input terminal 111 from the output terminals 121, 122, and 124 corresponding to the other frequency bands.

The switch element 40B connects the input terminal 411 corresponding to the third frequency band to the output terminal 421 corresponding to the RFIC 3A, and also disconnects the input terminal 412 from the output terminal 422 corresponding to the RFIC 3B. In other words, in the first preferred embodiment of the present invention, the switch element 40B selectively connects or disconnects the input terminals and the output terminals so that one of the first signal paths 31A through 31D on which the first matching circuit including one of the two electromagnetically coupled components is disposed (in this case, the first signal path 31C on which the first matching circuit 20C is disposed) is able to be connected to one of the second signal paths 51A through 51D on which the second matching circuit including the other component is disposed (in this case, the second signal path 51C on which the second matching circuit 50C is disposed).

The connection and disconnection states of the switch element 40A are preferably not restricted, and the switch element 40A may be operated similarly to the switch element 40B.

In a manner the same as or similar to the above-described received signal of the second frequency band, between the antenna terminal Pant and the receive terminal Prxc, the received signal input into the antenna terminal Pant propagates, not only through a path (main path) via the switch element 40B, but also through a path (sub path) from the first matching circuit 20C to the second matching circuit 50C not via the switch element 40B. By adjusting the degree of electromagnetic coupling between the first matching circuit 20C and the second matching circuit 50C, the amplitude and the phase of the received signal propagating through the sub path are able to be adjusted.

Accordingly, in the first preferred embodiment of the present invention, when a signal of the third frequency band is received, as well as when a signal of the second frequency band is received, it is possible to obtain desired transmission characteristics of the radio-frequency module 1.

The transmission characteristics of the radio-frequency module 1 will be described below through illustration of the bandpass characteristic, in comparison with a comparative example of the first preferred embodiment of the present invention.

The configuration of a radio-frequency module of a comparative example is similar to that of the first preferred embodiment of the present invention, except that the first matching circuits 20B and 20C are not electromagnetically coupled with the second matching circuits 50B and 50C, respectively.

Figure 3:
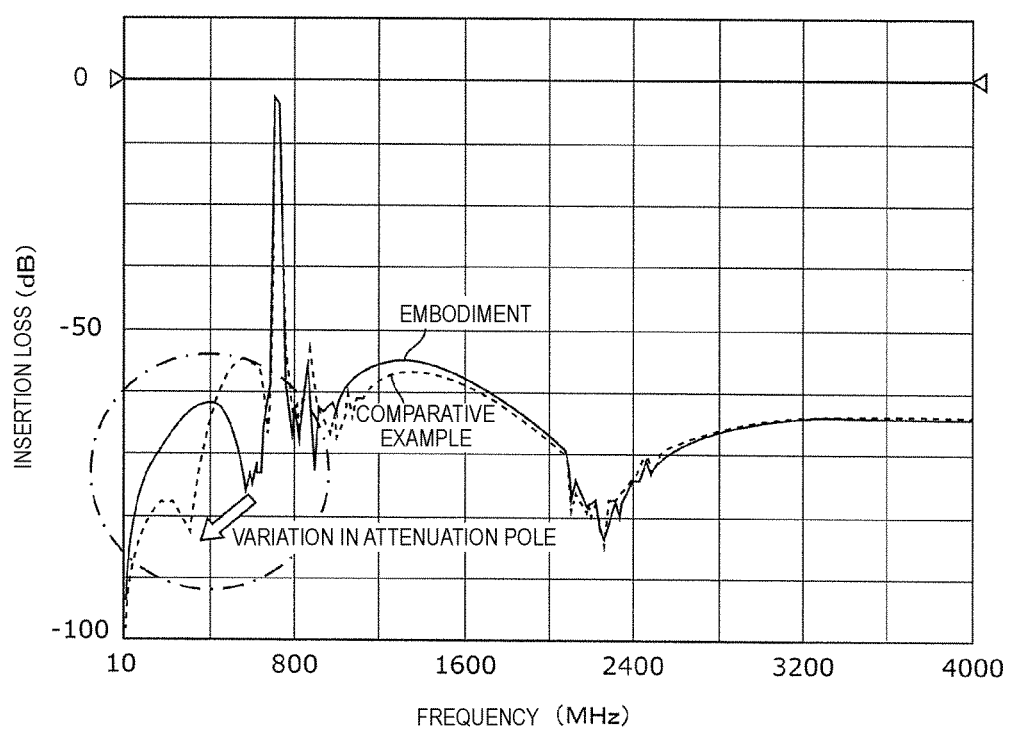
FIG. 3 is a graph illustrating an example of a bandpass characteristic (frequency characteristic) of the radio-frequency module of the first preferred embodiment of the present invention in comparison with that of a comparative example.

FIG. 3 is a graph illustrating an example of the bandpass characteristic (frequency characteristic) of the radio-frequency module 1 of the first preferred embodiment of the present invention in comparison with that of the comparative example. More specifically, FIG. 3 illustrates the bandpass characteristic of the radio-frequency module 1 (indicated by "preferred embodiment" in FIG. 3) and that of the comparative example when a signal of the second frequency band is received. In FIG. 3, the horizontal axis indicates the frequency, while the vertical axis indicates the insertion loss of the received signal (the attenuation of the received signal propagating from the antenna terminal Pant to the receive terminal Prxb).

As shown in FIG. 3, the bandpass characteristic of the first preferred embodiment of the present invention shows that the attenuation pole varies more noticeably in accordance with the frequency, compared with the bandpass characteristic of the comparative example. In the first preferred embodiment of the present invention, since the first matching circuit 20B and the second matching circuit 50B are electromagnetically coupled with each other, the transmission characteristics such as the bandpass characteristic vary more noticeably than those in the comparative example. In the first preferred embodiment of the present invention, by adjusting the degree of electromagnetic coupling between the first matching circuit 20B and the second matching circuit 50B, the attenuation pole of the bandpass characteristic is able to be suitably adjusted. As a result, desired, improved transmission characteristics are able to be obtained.

Advantages preferably achieved by the above-described radio-frequency module 1 will be discussed below. The following description of the first and second matching circuits 20B and 50B also applies to the first and second matching circuits 20C and 50C to a large extent. Accordingly, advantages preferably obtained by the radio-frequency module 1 will be discussed mainly with reference to the first and second matching circuits 20B and 50B, and reference to the first and second matching circuits 20C and 50C will be omitted or simplified.

As described above, in the radio-frequency module 1 of the first preferred embodiment of the present invention, since a component included in the first matching circuit 20B (in the first preferred embodiment of the present invention, the inductor 221) and a component included in the second matching circuit 50B (in the first preferred embodiment of the present invention, the inductor 522) are electromagnetically coupled with each other, the transmission characteristics vary more noticeably than in a radio-frequency module in which corresponding components are not electromagnetically coupled with each other. The transmission characteristics of the sub path are influenced by the degree of electromagnetic coupling between the first matching circuit 20B and the second matching circuit 50B, that is, the degree of electromagnetic coupling between the inductors 221 and 522, for example. Accordingly, by adjusting the degree of electromagnetic coupling, the transmission characteristics are able to be adjusted. It is thus possible to obtain improved transmission characteristics while supporting multiband communication.

In the radio-frequency module 1 of the first preferred embodiment of the present invention, the plural second signal paths 51A through 51D are provided. Accordingly, it is possible to switch between the propagation path for radio-frequency signals of the low frequency band group and the propagation path for radio-frequency signals of the high frequency band group. Generally, a frequency-dependent matching circuit is able to be provided on each of the second signal paths 51A through 51D, thus achieving a sufficient level of impedance matching in all the frequency bands. As a result, the insertion loss and the return loss of radio-frequency signals are able to be significantly reduced or prevented, thus obtaining even more improved transmission characteristics.

In the radio-frequency module 1 of the first preferred embodiment of the present invention, components included in plural first matching circuits (in the first preferred embodiment of the present invention, the two first matching circuits 20B and 20C) and components included in plural second matching circuits (in the first preferred embodiment of the present invention, the two second matching circuits 50B and 50C) are electromagnetically coupled with each other. It is thus possible to obtain improved transmission characteristics for plural radio-frequency signals having different pass bands (in the first preferred embodiment of the present invention, the second and third frequency bands).

In the radio-frequency module 1 of the first preferred embodiment of the present invention, the switch element 40A connects the electromagnetically coupled components of the first matching circuit 20B and the second matching circuit 50B. Accordingly, a radio-frequency signal propagates through the following paths in the radio-frequency module 1. The radio-frequency signal propagates, not only through the main path via the first matching circuit 20B, the switch element 40A, and the second matching circuit 50B, but also through the sub path from the first matching circuit 20B to the second matching circuit 50B not via the switch element 40A. Thus, the transmission characteristics of the radio-frequency module 1 include the combined transmission characteristics of the main path and the sub path. The transmission characteristics of the sub path are influenced by the degree of electromagnetic coupling between the above-described components. Accordingly, by adjusting the degree of electromagnetic coupling, the combined transmission characteristics are able to be adjusted. As a result, improved transmission characteristics are able to obtained.

In the radio-frequency module 1 of the first preferred embodiment of the present invention, the switch element 40A preferably selectively connects or disconnects the first signal path and the second signal path for a radio-frequency signal of a low frequency band, while the switch element 40B preferably selectively connects or disconnects the first signal path and the second signal path for a radio-frequency signal of a high frequency band. As a result, it is possible to obtain improved transmission characteristics for both of the low frequency band and the high frequency band.

The radio-frequency module 1 of the first preferred embodiment of the present invention is connected to plural RFICs (in the first preferred embodiment of the present invention, two RFICs 3A and 3B). The switch element 40A selectively connects or disconnects a first signal path through which a radio-frequency signal of a low frequency band passes (in the first preferred embodiment of the present invention, the first signal paths 31A and 31B) and a second signal path corresponding to plural RFICs (in the first preferred embodiment of the present invention, the second signal paths 51A and 51B). The switch element 40B selectively connects or disconnects a first signal path through which a radio-frequency signal of a high frequency band passes (in the first preferred embodiment of the present invention, the first signal paths 31C and 31D) and a second signal path corresponding to plural RFICs (in the first preferred embodiment of the present invention, the second signal paths 51C and 51D). It is thus possible to obtain improved transmission characteristics while supporting multiband communication and multiple RFICs.

Generally, a component included in a circuit on the input side of a switch element and a component included in a circuit on the output side thereof are separately disposed. Accordingly, it is difficult to secure an improved degree of electromagnetic coupling between these components. In contrast, in the radio-frequency module 1 of the first preferred embodiment of the present invention, by disposing a component included in the first matching circuit 20B and a component included in the second matching circuit 50B close or adjacent to each other, an improved degree of electromagnetic coupling between these components is able to be secured. Accordingly, since the degree of electromagnetic coupling is able to be adjusted in a wide range, the transmission characteristics are able to be adjusted with high precision, thus achieving even more improved transmission characteristics.

In the radio-frequency module 1 of the first preferred embodiment of the present invention, the distance between a component included in the first matching circuit 20B and a component included in the second matching circuit 50B is preferably smaller than the distances between the component included in the first matching circuit 20B and the other components. This makes it possible to significantly reduce or prevent electromagnetic coupling between the component included in the first matching circuit 20B and the other components. At the same time, electromagnetic coupling between the component included in the first matching circuit 20B and the component included in the second matching circuit 50B is improved. As a result, improved transmission characteristics are able to be obtained.

If, in a plan view of the module substrate 70, the component included in the first matching circuit 20B is disposed on one of the two areas of the module substrate 70 with respect to a straight line (the imaginary line J in FIG. 2) passing through the switch elements, while the component included in the second matching circuit 50B is disposed on the other area, these components may not be electromagnetically coupled with each other. In contrast, in the radio-frequency module 1 of the first preferred embodiment of the present invention, since these components are disposed on one of the two areas of the module substrate 70 with respect to the straight line, they are able to be reliably electromagnetically coupled with each other. As a result, improved transmission characteristics are able to be obtained.

In the radio-frequency module 1 of the first preferred embodiment of the present invention, the second matching circuit 50B is disposed close or adjacent to or on one side of the module substrate 70, while another second matching circuit (in the first preferred embodiment of the present invention, the second matching circuit 50A or 50C) is disposed close to or on the opposing side of the module substrate 70. This makes it possible to significantly reduce or prevent unwanted electromagnetic coupling between the second matching circuit 50B and this matching circuit. As a result, improved transmission characteristics are able to be obtained. This is particularly effective when a small module substrate 70 is used in accordance with a reduced size of the radio-frequency module 1, for example.

In the radio-frequency module 1 of the first preferred embodiment of the present invention, three matching circuits included in the first matching circuit group (first matching circuits 20A through 20C) are preferably disposed close or adjacent to three different sides of the module substrate 70. This makes it possible to significantly reduce or prevent unwanted electromagnetic coupling among the three matching circuits. As a result, improved transmission characteristics are able to be obtained. This is also particularly effective when a small module substrate 70 is used in accordance with a reduced size of the radio-frequency module 1, for example.

In the first preferred embodiment of the present invention, the first matching circuits 20B and 20C preferably are electromagnetically coupled with the second matching circuits 50B and 50C, respectively. However, combinations of first and second matching circuits to be electromagnetically coupled with each other are not restricted to the combinations discussed in the first preferred embodiment of the present invention. As a radio-frequency module of a first modified example of the first preferred embodiment of the present invention, the configuration in which different combinations of first and second matching circuits are electromagnetically coupled with each other will be described below. The circuit configuration of the radio-frequency modules of the first through third modified examples is similar to that of the first preferred embodiment of the present invention, and thus, an explanation thereof will be omitted or simplified.

Figure 4:
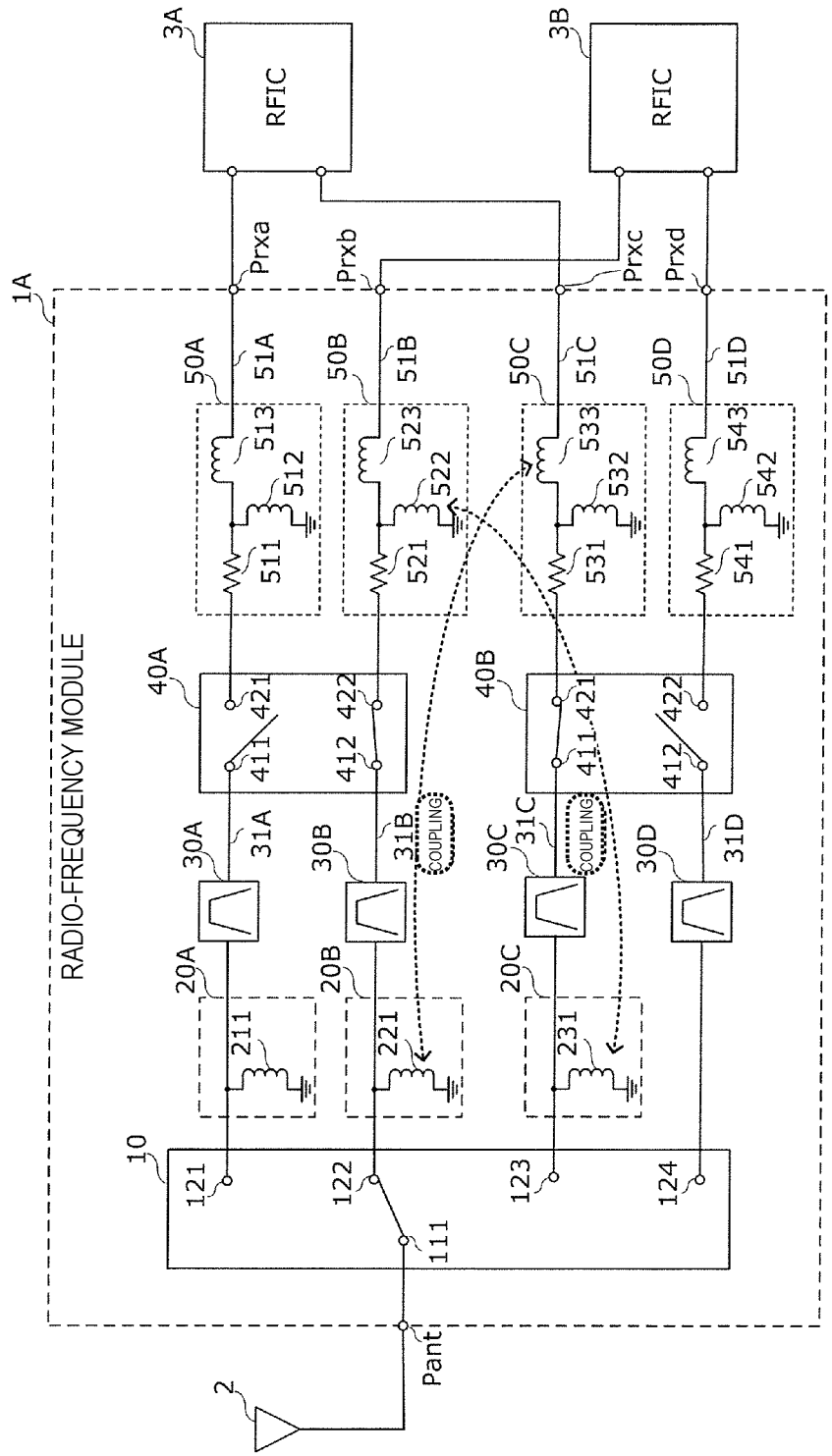
FIG. 4 is a circuit diagram illustrating the circuit configuration of a radio-frequency module according to a first modified example of the first preferred embodiment of the present invention.

FIG. 4 is a circuit diagram illustrating the circuit configuration of a radio-frequency module 1A according to the first modified example.

The radio-frequency module 1A shown in FIG. 4 is different from the radio-frequency module 1 of the first preferred embodiment of the present invention in that the first matching circuit 20B and the second matching circuit 50C are electromagnetically coupled with each other and the first matching circuit 20C and the second matching circuit 50B are electromagnetically coupled with each other. More specifically, the inductor 221 of the first matching circuit 20B and the inductor 533 of the second matching circuit 50C are preferably electromagnetically coupled, and the inductor 231 of the first matching circuit 20C and the inductor 522 of the second matching circuit 50B are preferably electromagnetically coupled.

In the first preferred embodiment of the present invention, the switch element 40A selectively connects or disconnects the first signal paths 31A and 31B and the second signal paths 51A and 51B so that the first matching circuit 20B including one of the electromagnetically coupled components is able to be connected to the second matching circuit 50B including the other component. The switch element 40B selectively connects or disconnects the first signal paths 31C and 31D and the second signal paths 51C and 51D so that the first matching circuit 20C including one of the electromagnetically coupled components is able to be connected to the second matching circuit 50C including the other component.

In contrast, in the first modified example, the switches 40A and 40B selectively connect or disconnect the first signal paths 31A through 31D and the second signal paths 51A through 51D so that the first matching circuit 20B including one of the electromagnetically coupled components will not be connected to the second matching circuit 50C including the other component. The switches 40A and 40B also selectively connect or disconnect the first signal paths 31A through 31D and the second signal paths 51A through 51D so that the first matching circuit 20C including one of the electromagnetically coupled components will not be connected to the second matching circuit 50B including the other component. That is, the switch elements 40A and 40B are set to be a connection state or a disconnection state so that electromagnetically coupled components of the first and second matching circuits will preferably not be connected to each other.

In the radio-frequency module 1A as described above, the switch elements 40A and 40B preferably do not connect the electromagnetically coupled components of the first matching circuit and the second matching circuit. Accordingly, due to the occurrence of mutual induction in electromagnetically coupled components, the effective inductance value of each of the electromagnetically coupled components is able to be changed. Because of this reason, in the radio-frequency module 1A, the transmission characteristics are able to vary more noticeably than in the configuration in which components are not electromagnetically coupled with each other. The amount by which the transmission characteristics vary is influenced by the degree of electromagnetic coupling. Accordingly, by adjusting the degree of electromagnetic coupling, the attenuation pole of the bandpass characteristic, for example, is able to suitably be adjusted. As a result, an improved transmission characteristics is able to be obtained.

By the use of the radio-frequency module 1A, advantages similar or the same as those obtained by the radio-frequency module 1 are achieved.

In the radio-frequency modules 1 and 1A of the first preferred embodiment of the present invention and the first modified example thereof, preferably a radio-frequency signal of one of the multiple frequency bands selectively propagates through the radio-frequency module 1 or 1A. However, the carrier aggregation (CA) system in which radio-frequency signals of multiple frequency bands are simultaneously transmitted or received may be applied to the radio-frequency module 1 or 1A. As a radio-frequency module according to a second modified example of the first preferred embodiment of the present invention, a CA-based radio-frequency module will be described below.

Figure 5:
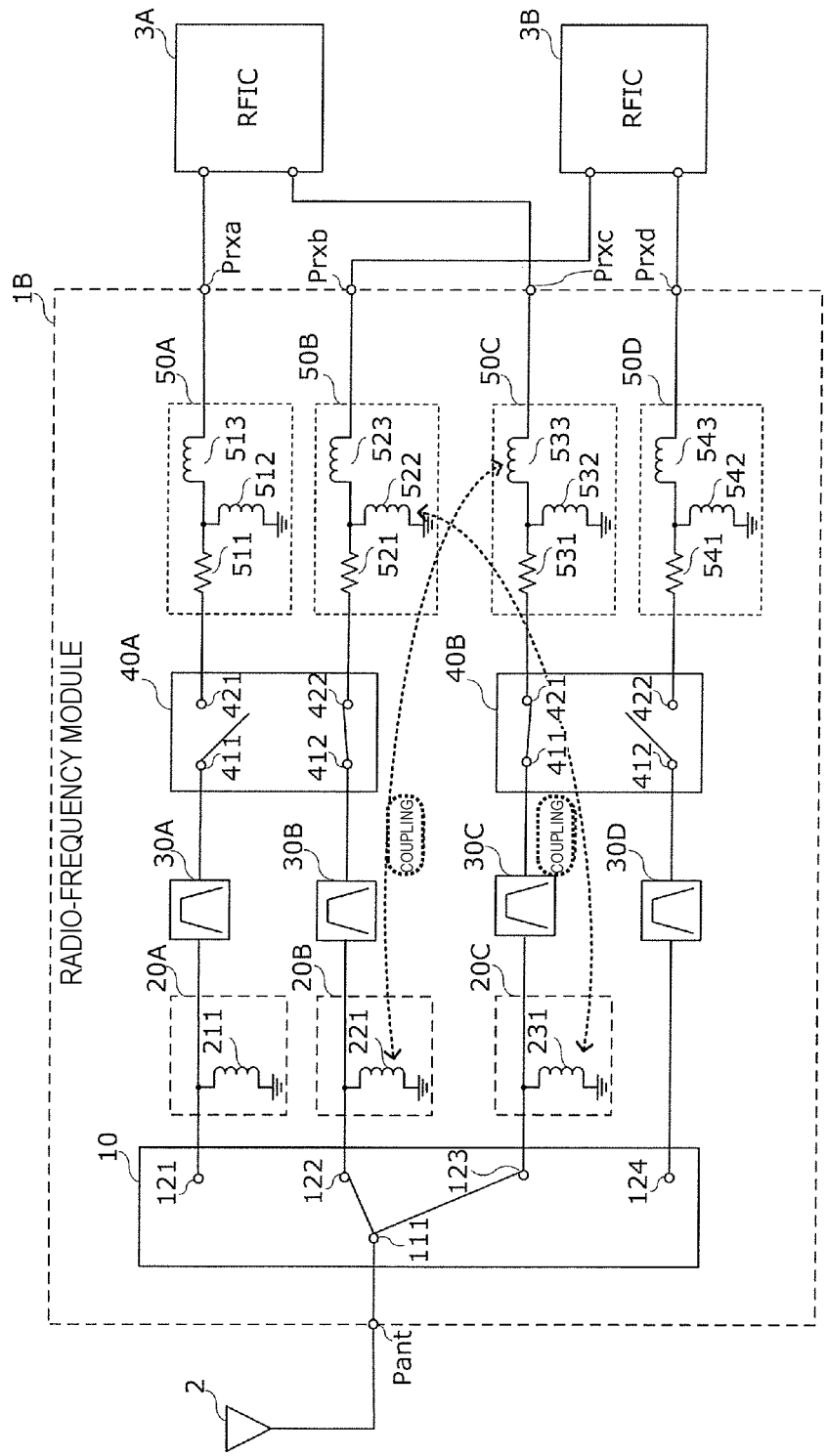
FIG. 5 is a circuit diagram illustrating the circuit configuration of a radio-frequency module according to a second modified example of the first preferred embodiment of the present invention.

FIG. 5 is a circuit diagram illustrating the circuit configuration of a radio-frequency module 1B according to the second modified example.

The radio-frequency module 1B shown in FIG. 5 is based on the CA system in which communication is performed by simultaneously using two or more frequency bands selected from multiple frequency bands. In the radio-frequency module 1B shown in FIG. 5, communication is preferably performed by simultaneously using the second and third frequency bands included in the first through fourth frequency bands. Frequency bands to be simultaneously used for performing communication are not restricted to the second and third frequency bands, and the first and third frequency bands, for example, may be used. The number of frequency bands to be simultaneously used for performing communication is not restricted to two, and three or more frequency bands, for example, may be used.

In the radio-frequency module 1B, if signals of the second and third frequency bands are received from the antenna 2 and if the RFIC 3B performs signal processing on the received signal of the second frequency band and the RFIC 3A performs signal processing on the received signal of the third frequency band, the switch elements 10, 40A, and 40B are preferably operated in the following manner in accordance with an input control signal.

The switch element 10 connects the input terminal 111 to the output terminal 122 corresponding to the second frequency band and also connects the input terminal 111 to the output terminal 123 corresponding to the third frequency band. The switch element 10 preferably disconnects the input terminal 111 from the output terminals 121 and 124 corresponding to the other frequency bands.

The switch elements 40A and 40B selectively connect or disconnect the input terminals and the output terminals so that two or more of the first signal paths 31A through 31D corresponding to two or more frequency bands (in the second modified example, the first signal paths 31B and 31C corresponding to the second and third frequency bands, respectively) are able to be simultaneously connected to two or more of the second signal paths 51A through 51D (in the second modified example, the second signal paths 51B and 51C).

More specifically, the switch element 40A connects the input terminal 412 corresponding to the second frequency band to the output terminal 422 corresponding to the RFIC 3B, and also disconnects the input terminal 411 from the output terminal 421 corresponding to the RFIC 3A. The switch element 40B connects the input terminal 411 corresponding to the third frequency band to the output terminal 421 corresponding to the RFIC 3A, and also disconnects the input terminal 412 from the output terminal 422 corresponding to the RFIC 3B.

As a result of the switch elements 10, 40A, and 40B being operated in this manner, a received signal of the second frequency band input into the antenna terminal Pant from the antenna 2 passes through the switch element 10 and the first matching circuit 20B, and is subjected to filtering in the band pass filter 30B, and then passes through the switch element 40A and the second matching circuit 50B and is output to the RFIC 3B from the receive terminal Prxb, for example.

Meanwhile, a received signal of the third frequency band input into the antenna terminal Pant from the antenna 2 passes through the switch element 10 and the first matching circuit 20C, and is subjected to filtering in the band pass filter 30C, and then passes through the switch element 40B and the second matching circuit 50C and is output to the RFIC 3A from the receive terminal Prxc, for example.

A component included in the first matching circuit 20B (in this case, the inductor 221) and a component included in the second matching circuit 50C (in this case, the inductor 533) are electromagnetically coupled with each other. A component included in the first matching circuit 20C (in this case, the inductor 231) and a component included in the second matching circuit 50B (in this case, the inductor 522) are electromagnetically coupled with each other. That is, the first matching circuits 20B and 20C are respectively connected to the second matching circuits 50C and 50B in a radio-frequency range. With this configuration, the above-described received signals propagate through the radio-frequency module 1B in the following manner.

The received signal of the second frequency band propagates, not only through a path (main path) via the switch element 40A, but also through a path (sub path) from the first matching circuit 20B to the second matching circuit 50C not via the switch element 40A. The received signal of the third frequency band propagates, not only through a path (main path) via the switch element 40B, but also through a path (sub path) from the first matching circuit 20C to the second matching circuit 50B not via the switch element 40B.

Hence, a combined signal of the received signal propagating through the main path and the received signal propagating through the sub path is output from each of the receive terminals Prxb and Prxc. That is, the transmission characteristics such as the attenuation characteristic (amplitude characteristic) and the phase characteristic of the radio-frequency module 1B are represented by the combined transmission characteristics including the main paths and the sub paths.

The transmission characteristics of the sub paths are influenced by the degree of electromagnetic coupling between the first matching circuit 20B and the second matching circuit 50C and between the first matching circuit 20C and the second matching circuit 50B. Accordingly, in the second modified example, by adjusting the degree of electromagnetic coupling between the first matching circuit 20B and the second matching circuit 50C and between the first matching circuit 20C and the second matching circuit 50B, the amplitude and the phase of the received signals propagating through the sub paths are able to be adjusted.

Accordingly, even in the application of the CA system in which communication is preferably performed by simultaneously using the second and third frequency bands, desired transmission characteristics of the radio-frequency module 1B are able to be obtained. That is, in the radio-frequency module 1B of the second modified example, it is possible to obtain improved transmission characteristics while supporting multiband communication and the CA system.

In the first preferred embodiment of the present invention, electromagnetically coupled components preferably are components (chip components) mounted on the module substrate 70. However, at least one of the components to be electromagnetically coupled with each other may be a component integrated in the module substrate 70. As a radio-frequency module according to a third modified example of the first preferred embodiment of the present invention, the preferable configuration in which components integrated in the module substrate 70 are electromagnetically coupled with each other will be described below.

Figure 6:
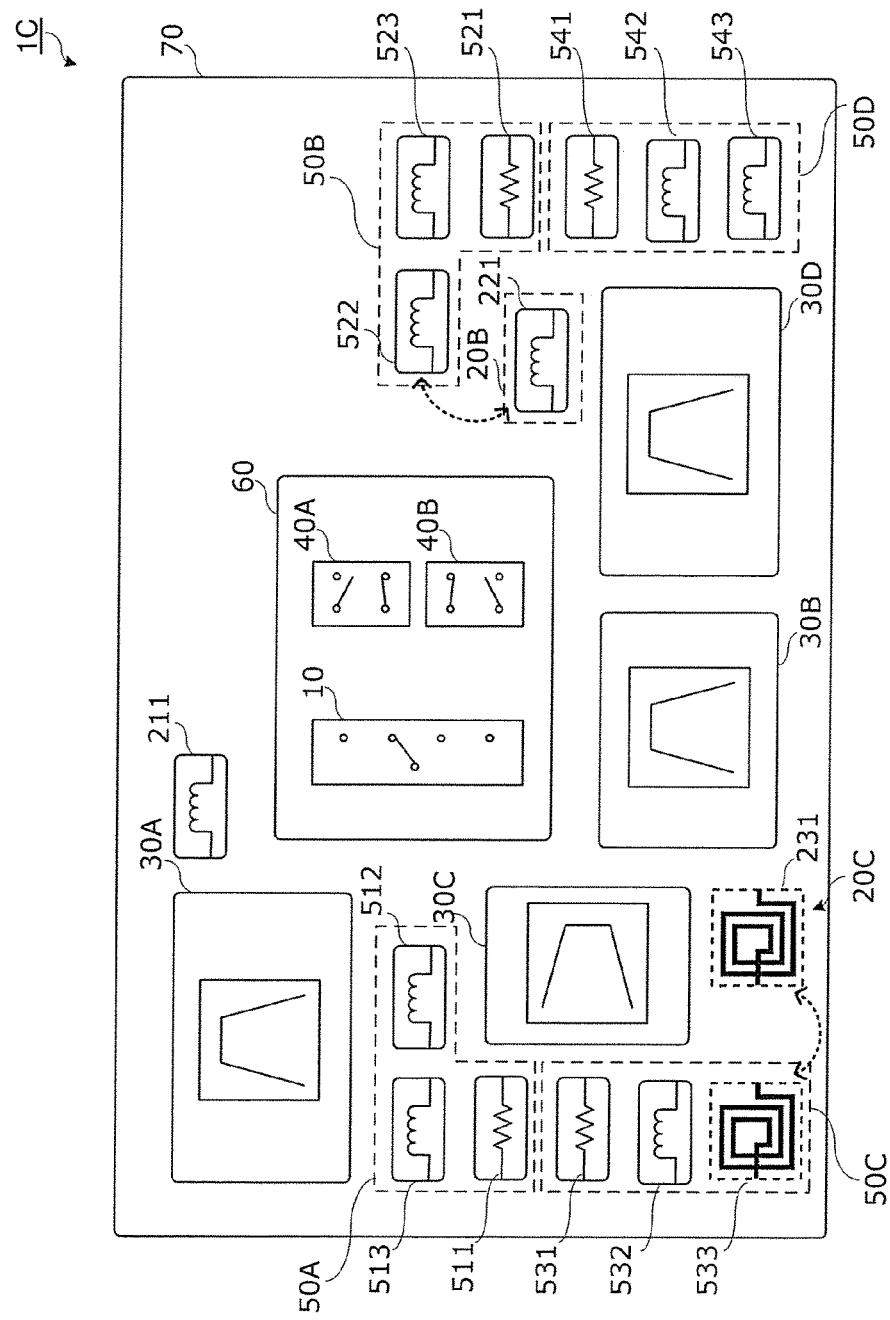
FIG. 6 is a plan view schematically illustrating the layout of components on a mounting surface of a radio-frequency module according to a third modified example of the first preferred embodiment of the present invention.

FIG. 6 is a plan view schematically illustrating the layout of components included on the mounting surface of a radio-frequency module 1C according to the third modified example.

As shown in FIG. 6, the inductors 533 and 231 are integrated in the module substrate 70 and preferably include coil pattern conductors in a multilayered structure within the module substrate 70.

With this configuration, by adjusting the distance between the inductors 533 and 231, for example, the degree of electromagnetic coupling is able to be adjusted. In the radio-frequency module 1C of the third modified example, as well as in the radio-frequency module 1 of the first preferred embodiment of the present invention, by suitably adjusting the attenuation pole of the bandpass characteristic, improved transmission characteristics are able to be obtained.

In the radio-frequency module 1C, at least one of the components (in the third modified example, the inductors 533 and 231) included in the first matching circuits 20A through 20C and the second matching circuits 50A through 50D is integrated in the module substrate 70. This makes it possible to reduce the number of components mounted on the module substrate 70, thus enhancing the flexibility of the layout of the mounting surface of the module substrate 70.

In the radio-frequency module 1C, the first matching circuits 20A and 20B and the second matching circuits 50A and 50B corresponding to the LB band are all mounted on the module substrate 70, while some of the first matching circuit 20C and the second matching circuits 50C and 50D corresponding to the MB band are integrated in the module substrate 70.

Generally, as the frequency band is lower, the constant of an element included in a matching circuit becomes greater. Components such as chip components mounted on a substrate are likely to exhibit a greater constant than elements integrated in the substrate. Accordingly, with the above-described configuration, the flexibility of the layout of the mounting surface of the module substrate 70 is able to be enhanced while sufficiently securing impedance matching in the LB band.

In the third modified example, both of the inductors 533 and 231 are integrated in the module substrate 70. However, one of the inductors 533 and 231 may be mounted on the module substrate 70. Some of the other components included in the first matching circuits 20A through 20C and the second matching circuits 50A through 50D may be integrated in the module substrate 70. In a plan view of the module substrate 70, a component integrated in the module substrate 70 and a component mounted on the module substrate 70 may be located such that they overlap each other.

Second Preferred Embodiment

In a second preferred embodiment of the present invention, a communication device including the above-described radio-frequency module will be described below through illustration of a cellular phone.

Figure 7:
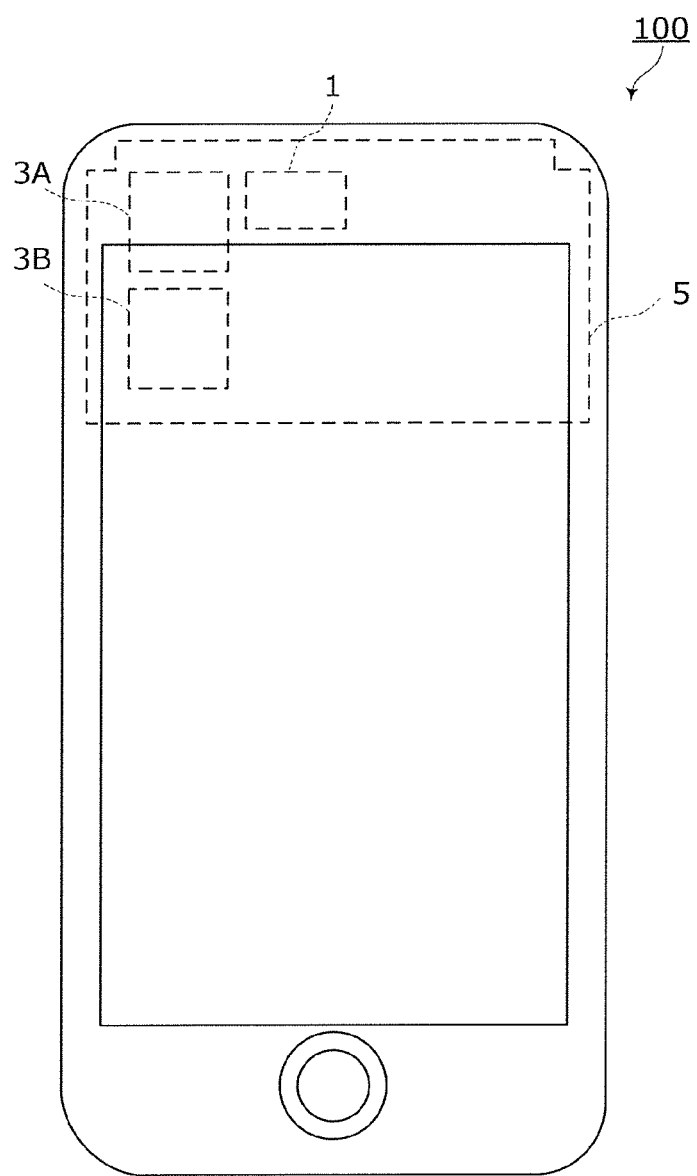
FIG. 7 is a plan view schematically illustrating a cellular phone according to a second preferred embodiment of the present invention.

FIG. 7 is a plan view schematically illustrating a cellular phone 100 according to the second preferred embodiment of the present invention.

The cellular phone 100 shown in FIG. 7 is a communication device including the RFICs 3A and 3B and the radio-frequency module 1 of the first preferred embodiment of the present invention. The RFICs 3A and 3B and the radio-frequency module 1 are preferably mounted on the same mother substrate 5 and stored within a casing of the cellular phone 100. At least one of the RFICs 3A and 3B and the radio-frequency module 1 may be mounted on another substrate different from the mother substrate 5.

According to the second preferred embodiment of the present invention, like the cellular phone 100 including the above-described radio-frequency module 1, it is possible to implement a high-quality communication device which secures improved transmission characteristics while supporting multiband communication.

The radio-frequency module included in the cellular phone 100 is not restricted to the radio-frequency module 1, and may be one of the radio-frequency modules 1A, 1B, and 1C of the first through third modified examples. In the cellular phone 100 including one of the radio-frequency modules 1A, 1B, and 1C, advantages similar to those achieved by the second preferred embodiment of the present invention are able to be obtained. A communication device such as the cellular phone 100 may also include the antenna 2 discussed in the first preferred embodiment of the present invention.

Other Preferred Embodiments

The present invention has been discussed through illustration of the preferred embodiments of the present invention and modified examples of the preferred embodiments of the present invention. However, the radio-frequency modules and communication devices are not restricted to those in the preferred embodiments of the present invention and modified examples of the preferred embodiments of the present invention. The elements in the above-described preferred embodiments of the present invention and modified examples of the preferred embodiments of the present invention may be combined in any manner to realize other preferred embodiments, and various modifications apparent to those skilled in the art may be made to the preferred embodiments of the present invention or modified examples of the preferred embodiments of the present invention without departing from the scope and spirit of the present invention. Such preferred embodiments of the present invention and modified examples of the preferred embodiments of the present invention are also encompassed within the present invention. Additionally, various apparatuses integrating the radio-frequency module or the communication device described above therein are also encompassed within the present invention.

The above-described radio-frequency module is preferably disposed between the antenna 2 and the plural RFICs 3A and 3B and includes the plural first matching circuits 20A through 20C, the plural second signal paths 51A through 51D, and the plural second matching circuits 50A through 50D. However, the radio-frequency module may be disposed between the antenna 2 and one RFIC and include one first matching circuit disposed on one of the plural first signal paths and one second matching circuit disposed on a single second signal path.

Figure 8:
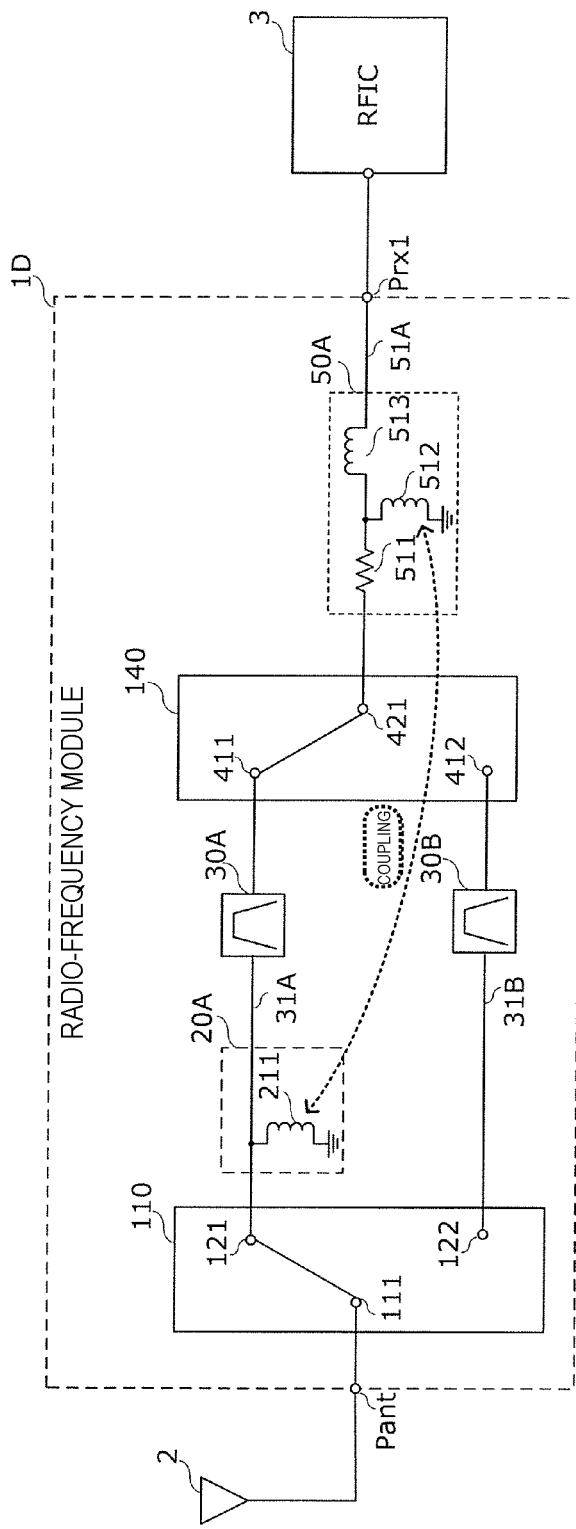
FIG. 8 is a circuit diagram illustrating the circuit configuration of a radio-frequency module according to another preferred embodiment of the present invention.

FIG. 8 is a circuit diagram illustrating the circuit configuration of such a radio-frequency module 1D. The radio-frequency module 1D is disposed between the antenna 2 and an RFIC 3 including an LB-band receive terminal, and includes none of the first matching circuit 20B and the signal paths and matching circuits corresponding to the MB band and another RFIC included in the radio-frequency module 1 of the first preferred embodiment of the present invention. That is, switch elements 110 and 140 provided instead of the switch elements 10, 40A, and 40B do not include input terminals and output terminals corresponding to the MB band and another RFIC. In the radio-frequency module 1D, a first matching circuit 20A and a second matching circuit 50A are electromagnetically coupled with each other.

Another first matching circuit may be disposed on the first signal path 31B, and may be electromagnetically coupled with the second matching circuit 50A. In the above descriptions, first matching circuits and second matching circuits are preferably electromagnetically coupled with each other based on a one-to-one correspondence. However, a first matching circuit and a second matching circuit may be electromagnetically coupled with another second matching circuit and another first matching circuit, respectively.

A component included in first matching circuits and a component included in second matching circuits electromagnetically coupled with each other are not restricted to those described in the above. Any combination of a certain one of the components included in the first matching circuits and a certain one of the components included in the second matching circuits is possible. In principle, according to the layout of components included on the mounting surface of the module substrate, the components included in the radio-frequency module are arranged so that the wiring patterns connecting between the circuits and between the elements shown in the circuit diagrams are able to be significantly reduced or minimized. In such a layout, the distance between a component included in a first matching circuit and a component included in a second matching circuit electromagnetically coupled with each other and a relative arrangement of these components are determined so that improved transmission characteristics are able to be obtained.

In the above, the radio-frequency module includes one antenna terminal Pant. However, the radio-frequency module may have plural antenna terminals. That is, the radio-frequency module may be connected to plural antennas 2.

The radio-frequency module may not necessarily include the switch element 10. Alternatively, the radio-frequency module may include a diplexer which separates LB-band radio-frequency signals and MB-band radio-frequency signals from each other. Plural first signal paths may be connected by using a common node or may be connected to plural different antennas.

In the first preferred embodiment of the present invention and the modified examples thereof, the plural RFICs 3A and 3B may be one RFIC.

The radio-frequency module may be operated by selectively switching between a CA mode in which communication is performed by simultaneously using multiple frequency bands and a non-CA mode in which communication is performed by using only one of the frequency bands.

In the above, the radio-frequency module may be disposed on the transmit-side front-end module, instead of on the receive-side front-end module.

In the radio-frequency module, another radio-frequency circuit element and a wiring pattern may be disposed between certain circuit elements and between certain signal paths shown in the drawings.

Preferred embodiments of the present invention are widely applicable to communication devices such as cellular phones, as a multiband-support radio-frequency module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module that transmits or receives radio-frequency signals of a plurality of frequency bands, the radio-frequency module comprising:
   a switch element;
   a first signal path connected between one end of the switch element and an antenna terminal;
   a band pass filter that is connected to the first signal path and that allows a radio-frequency signal of one of the plurality of frequency bands to pass through the band pass filter;
   a first matching circuit connected to the first signal path;
   a second signal path connected to the switch element; and
   a second matching circuit connected to the second signal path; wherein
   a component included in the first matching circuit and a component included in the second matching circuit are electromagnetically coupled with each other.

2. The radio-frequency module according to claim 1, wherein
   the first signal path includes a plurality of first signal paths;
   the second signal path includes a plurality of second signal paths; and
   the switch element selectively connects or disconnects each of the plurality of first signal paths and a corresponding one of the plurality of second signal paths.

3. The radio-frequency module according to claim 1, wherein the band pass filter includes a surface acoustic wave filter or an elastic wave filter.

4. The radio-frequency module according to claim 1, wherein
   the component included in the first matching circuit is a first inductor and the component included in the second matching circuit is a second inductor;
   the first inductor includes first coils with a first winding axis and the second inductor includes second coils with a second winding axis; and
   the first winding axis is parallel or substantially parallel to the second winding axis.

5. The radio-frequency module according to claim 1, wherein the first matching circuit includes a plurality of inductors shunt-connected to a ground.

6. The radio-frequency module according to claim 2, wherein
   the first matching circuit is disposed on each of two or more of the plurality of first signal paths;

the second matching circuit is disposed on each of two or more of the plurality of second signal paths; and components included in at least a portion of the first matching circuits are electromagnetically coupled with corresponding components included in at least a portion of the second matching circuits.

7. The radio-frequency module according to claim 2, further comprising:
an additional switch element that includes one or more input terminals connected to the antenna terminal and a plurality of output terminals; wherein
the plurality of output terminals correspond to the plurality of first signal paths.

8. The radio-frequency module according to claim 7, wherein the switch element and the additional switch element are included in a single IC package.

9. The radio-frequency module according to claim 2, wherein
the switch element is selectively set to be in a connecting state or a disconnecting state so that a component included in the first matching circuit on a first signal path and a component included in the second matching circuit on a second signal path will be connected to each other; and
the component included in the first matching circuit and the component included in the second matching circuit are electromagnetically coupled with each other.

10. The radio-frequency module according to claim 2, wherein
the switch element is selectively set to be in a connecting state or a disconnecting state so that a component included in the first matching circuit on a first signal path and a component included in the second matching circuit on a second signal path will not be connected to each other; and
the component included in the first matching circuit and the component included in the second matching circuit are electromagnetically coupled with each other.

11. The radio-frequency module according to claim 2, wherein
the switch element selectively connects or disconnects each of the plurality of first signal paths and a corresponding one of the plurality of second signal paths through which a radio-frequency signal of a low frequency band included in the plurality of frequency bands passes; and
the switch element selectively connects or disconnects each of the plurality of first signal paths and a corresponding one of the plurality of second signal paths through which a radio-frequency signal of a high frequency band included in the plurality of frequency bands passes.

12. The radio-frequency module according to claim 2, wherein
a carrier aggregation system in which radio-frequency signals of at least two of the plurality of frequency bands are simultaneously transmitted or received is applied to the radio-frequency module; and
the switch element is selectively set to be in a connecting state or a disconnecting state so that at least two of the plurality of first signal paths and at least two of the plurality of second signal paths will be simultaneously connected to each other.

13. The radio-frequency module according to claim 1, further comprising:
a module substrate to mount the switch element thereon; wherein each of the first and second matching circuits includes a component to be mounted on the module substrate or a component to be integrated in the module substrate; and
a component included in the first matching circuit and a component included in the second matching circuit are disposed close or adjacent to each other.

14. The radio-frequency module according to claim 13, wherein a distance between the component included in the first matching circuit and the component included in the second matching circuit is smaller than a distance between the component included in the first matching circuit and another component mounted on the module substrate or integrated in the module substrate.

15. The radio-frequency module according to claim 13, wherein, in a plan view of the module substrate, the component included in the first matching circuit and the component included in the second matching circuit are disposed on one of two areas of the module substrate with respect to a straight line passing through the switch element.

16. The radio-frequency module according to claim 13, further comprising:
a second matching circuit group that includes a plurality of matching circuits which include the second matching circuit; wherein
in a plan view of the module substrate, the component included in the second matching circuit is disposed close or adjacent to a first side of an outer periphery of the module substrate; and
in a plan view of the module substrate, a component included in a matching circuit of the second matching circuit group which is different from the second matching circuit is disposed close or adjacent to a second side which opposes the first side.

17. The radio-frequency module according to claim 13, further comprising:
a first matching circuit group that includes three matching circuits which include the first matching circuit; wherein
in a plan view of the module substrate, components included in the three matching circuits are disposed close or adjacent to three different sides of an outer periphery of the module substrate.

18. The radio-frequency module according to claim 13, wherein
the module substrate is a multilayer substrate with a rectangular or substantially rectangular shape; and
the module substrate includes a plurality of stacked ceramic sheets or stacked epoxy resin sheets.

19. The radio-frequency module according to claim 13, wherein
the components included in the three matching circuits are disposed on a mounting surface of the module substrate; and
the module substrate includes a mounting electrode on a back side of the mounting surface.

20. A communication device comprising:
a radio-frequency integrated circuit that performs signal processing on radio-frequency signals of a plurality of frequency bands;
an antenna; and
the radio-frequency module according to claim 1 that is connected to the radio-frequency integrated circuit and the antenna.

* * * * *